United States Patent

Haga et al.

[15] 3,701,146

[45] Oct. 24, 1972

[54] ANALOG-DIGITAL CONVERTER USING AN INTEGRATOR

[72] Inventors: Ichiro Haga; Sieechi Tamada, both of Tokyo, Japan

[73] Assignee: Iwasaki Tsushinki Kabushiki Kaisha a/k/a Iwatsu Electric Co., Ltd.

[22] Filed: Dec. 7, 1970

[21] Appl. No.: 95,752

[30] Foreign Application Priority Data

Dec. 8, 1969 Japan ......................44/97813
Dec. 8, 1969 Japan ......................44/97814

[52] U.S. Cl. ..........................................340/347 NT
[51] Int. Cl. ......................H03k 13/10, H03k 13/14
[58] Field of Search ..................340/347 NT, 347 CC

[56] References Cited

UNITED STATES PATENTS

| | | | |
|---|---|---|---|
| 3,349,390 | 10/1967 | Glassman | 340/347 NT |
| 3,541,319 | 11/1970 | James | 340/347 NT |
| 3,544,895 | 12/1970 | Richman | 340/347 NT |
| 3,582,947 | 6/1971 | Harrison | 340/347 NT |

*Primary Examiner*—Thomas A. Robinson
*Assistant Examiner*—Jeremiah Glassman
*Attorney*—Robert E. Burns and Emmanuel J. Lobato

[57] ABSTRACT

An analog-digital converter using an integrator, in which after an analog signal is integrated by the integrator during a constant time, the input of the integrator is switched to a reference voltage reverse to the polarity of the input analog signal, and the time from the switching time of the input of the integrator to the time when the output of the integrator reaches a predetermined level is measured by counting clock pulses so that the counting result corresponds to the analogue value of the input analog-signal. The clock pulses are generated by a variable frequency oscillator and the repetition frequency of the clock pulses is controlled by a compared result between the counting result of an instant period and the counting result of an immediately adjacent period until the two counting results coincide with each other, so that effect of noise of any repetition frequency superposed on the input voltage is effectively eliminated.

4 Claims, 5 Drawing Figures

ANALOG-DIGITAL CONVERTER USING AN INTEGRATOR

This invention relates to an analog-digital converter using an integrator, in which after an input analog signal is integrated by the integrator during a constant time, the input of the integrator is switched to a reference voltage reverse to the polarity of the input analog signal, and the time from the switching time of the input of the integrator to the time when the output of the integrator reaches a predetermined reference level is measured by counting clock pulses so that the counting result corresponds to the analog value of the input analog-signal.

In an example of a conventional analog-digital converter of this type, an input voltage $Ei$ is applied to an integrator in response to the leading edge of a rectangular control signal, so that the output of the integrator varies in proportion to the input voltage $Ei$. The input voltage $Ei$ is integrated during a constant time $T$ from the time when the output of the integrator reaches a threshold level of a comparator. This integrating time $T$ is a correct time regulated by counting the number (e.g.; 1,000) of clock pulses from a constant frequency oscillator by a counter. After the constant time $T$, the input of the integrator is switched to a reference voltage $Es$ in response to the rear edge of the rectangular control signal, so that the output of the integrator varies in a direction reverse to the direction in the time $T$. The slope of this variation of the output of the integrator is proportional to the reference voltage $Es$. The time $Ti$ from the switching time of the input of the integrator to the time when the output of the integrator reaches again a threshold level of the comparator is obtained by counting the clock pulses by the counter during the time $Ti$. A converted output is generated in response to this counting result. The time $Ti$ is proportional to the input voltage $Ei$, and the above mentioned values $Ei$, $Es$, $T$ and $Ti$ have the following relationship:

$$(Ei/RC)T=(Es/RC)Ti$$

where the value $RC$ is a time constant of the integrator. From this relationship, the input voltage $Ei$ can be indicated as follows:

$$Ei=(Ti/T)Es=k\cdot Ti \quad 1.$$

where "K" is a constant. Accordingly, the input voltage $Ei$ can be indicated by a product of the time $Ti$ and a constant if the time $T$ and the reference voltage $Es$ are respectively constant. As understood from the equation (1), since a single integrator and a single clock pulse train are used at both the charging slope and the diacharging slope, deviation of the time constant $RC$ of the integrator and gentle fluctuation of the repetition frequency of the clock pulse are compensated.

On the other hand, noise superposed on the input voltage $Ei$ causes error in the converted output. In this case, error caused by only periodic noise can be eliminated by determining the time $T$ so as to be equal to an integer-multiple of the period of the periodic noise as mentioned below. If the repetition frequency of the clock pulses is a frequency $f_c$, the time $T$ can be indicated as follows:

$$T=(1/f_c)N \quad 2.$$

where "N" is a number corresponding to the number of repetions of the clock pulses. In this case, if the repetition frequency of noise superposed on the input signal $Ei$ is assumed as a value $f_n$, error caused by the noise can be eliminated when the following relationship is satisfied:

$$(1/f_c)K=T \quad 3.$$

where "K" is an integer. However, error caused by noise of only one periodic frequency can be eliminated so that it is very difficult to perform desired stable operation.

An object of this invention is to provide an analog-digital converter which eliminates the effect of noise of any repetition frequency superposed on the input voltage.

In accordance with a feature of this invention, the repetition frequency of clock pulses used to count a charging time and a discharging time in an analog-digital converter is designed so as to be variable while this repetion frequency of clock pulses is constant in a conventional analog-digital converter.

The principle of this invention will be understood from the following detailed discussion taken in conjunction with accompanying drawings, in which the same or equivalent parts are designated by the same reference numerals, characters and symbols, and in which.

Figure 1:
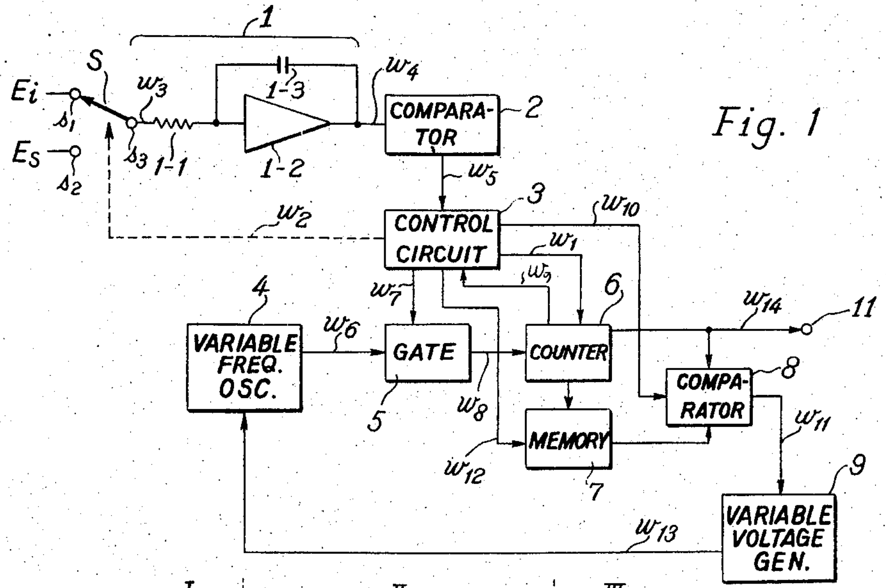
FIG. 1 is a block diagram illustrating an embodiment of this invention.
Figure 2:
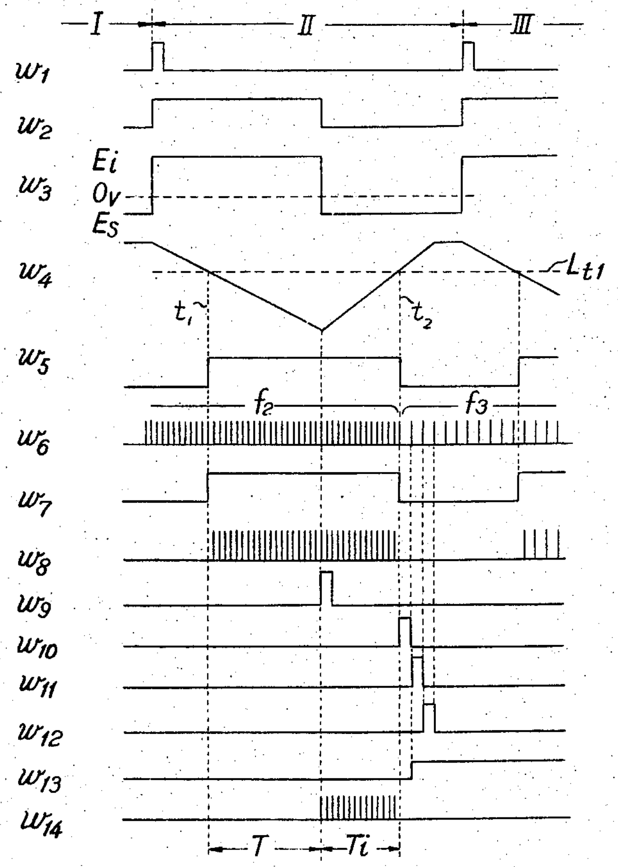
FIG. 2 shows time charts explanatory of the operation of the embodiment shown in FIG. 1.

In the embodiment of this invention shown in FIG. 1, an integrator 1 comprising a switch S, a resistor 1—1, a dc amplifier 1–2 and a capacitor 1–3, a comparator 2, a control circuit 3, an AND gate 5 and a counter 6 are similar to those of a conventional analog-digital converter. However, a variable frequency oscillator 4 is provided in place of a constant frequency oscillator of a conventional analog-digital converter. Moreover, a memory 7, a comparator 8 and a variable voltage generator 9 are newly provided. These circuits are described below with reference to time charts shown in FIG. 2.

The variable frequency oscillator 4 generates pulse train $w_6$ whose repetition cycle varies in response to deviation of an output voltage $w_{13}$ of the variable voltage generator 9. Accordingly, if the output voltage $w_{13}$ of the variable voltage generator 9 is constant, clock pulses ($w_6$) having a constant repetition cycle are generated from the variable frequency oscillator 4. By way of example, this variable frequency oscillator 4 is an oscillator using a variable capacitance diode or an astable multivibrator whose source voltage is controlled.

The memory 7 stores the counting result of the counter 6 in response to a control signal $w_{12}$ and applies the output to the comparator 8.

The comparator 8 compares the stored contents of the memory 7 with the counting result of the counter 6 in response to a control signal $w_{10}$ and generates an output $w_{11}$ applied to the variable voltage generator 9 if two inputs of the comparator 8 are different from each other.

The variable voltage generator 9 generates an output $w_{13}$ whose level varies in response to the output $w_{11}$ of the comparator 8. In other words, the output voltage $w_{13}$ steps up, by one step of voltage, in response to each pulse of the output $w_{11}$ of the comparator 8 and is restored to an initial voltage when the output $w_{13}$ reaches a predetermined voltage. An example of this variable voltage generator 9 is a staircase generator.

The operation of this embodiment is as follows. An input voltage $Ei$ and a reference voltage $E$ are integrated in the integrator 1 in a manner similar to the conventional analog-digital converter as mentioned above. It is now assumed that a measured result of a period *I* is stored in the memory 7 and that the variable frequency oscillator 4 generates clock pulses of a repetition frequency $f_2$. In response to a control signal $w_1$, measurement of a succeeding period II starts. The output $w_5$ of the comparator 2 deviates at the time $t_1$ when an output $w_4$ of the integrator 1 reaches a threshold level $L_{t1}$ of the comparator 2. This deviated output of the comparator 2 restores at the time $t_2$ to an initial voltage after a time $(T+Ti)$ from the time $t_1$, so that counting of the clock pulses $w_6$ by the counter 6 is completed at this time $t_2$. In this condition, the measured result of the period *I* stored in the memory 7 is compared, in the comparator 8, with the measured result of the period II obtained from the counter 6. If these two values are different from each other, this comparator 8 generates one pulse ($w_{11}$). In response to this pulse $w_{11}$, the variable voltage generator 9 steps up its output voltage $w_{13}$. Since this voltage $w_{13}$ is applied to the variable frequency oscillator 4, this variable frequency oscillator 4 deviates the frequency $f_2$ of the clock pulses $w_6$ to a frequency $f_3$ in response to the step-up of the output $w_{13}$ of the variable voltage generator 9. However, if the two inputs of the comparator 8 are the same, no output is generated from the comparator 8 so that the repetition frequency of the clock pulses $w_6$ is not deviated.

After changing the repetition frequency of the clock pulses $w_6$ from the frequency $f_2$ to the frequency $f_3$, measurement of a period III is started. In this case, since the time $T$ integrating the input voltage $E_i$ is determined in accordance with the number of repetitions of the clock pulses $w_3$ (e.g.; 1,000 repetions), the time length of the time $T$ is also changed. These measurements are repeated until a stable condition where a measurement result of an instant period is the same as a measurement result of an immediately preceding period. In other words, the repetition frequency of the clock pulses $w_6$ varies until the stable condition, and the condition indicated in the equation (3) is satisfied at the stable condition where periodic noise superposed on the input voltage is completely eliminated.

Figure 3:
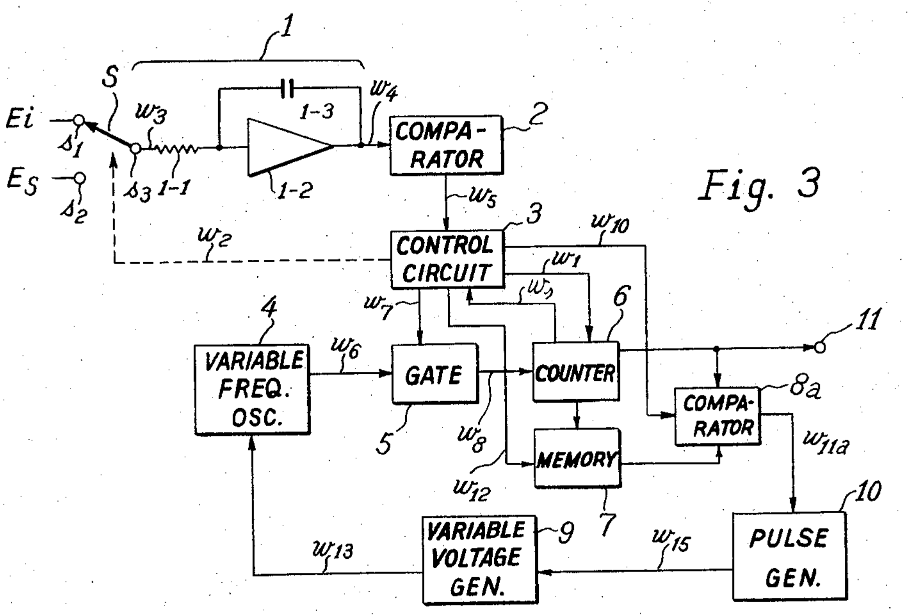
FIG. 3 is a block diagram illustrating another embodiment of this invention.
Figure 5:
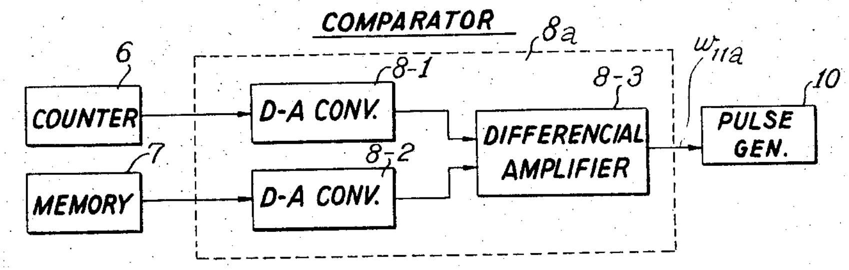
FIG. 5 is a block diagram illustrating an example of a comparator used in the embodiment shown in FIG. 3.
Figure 4:
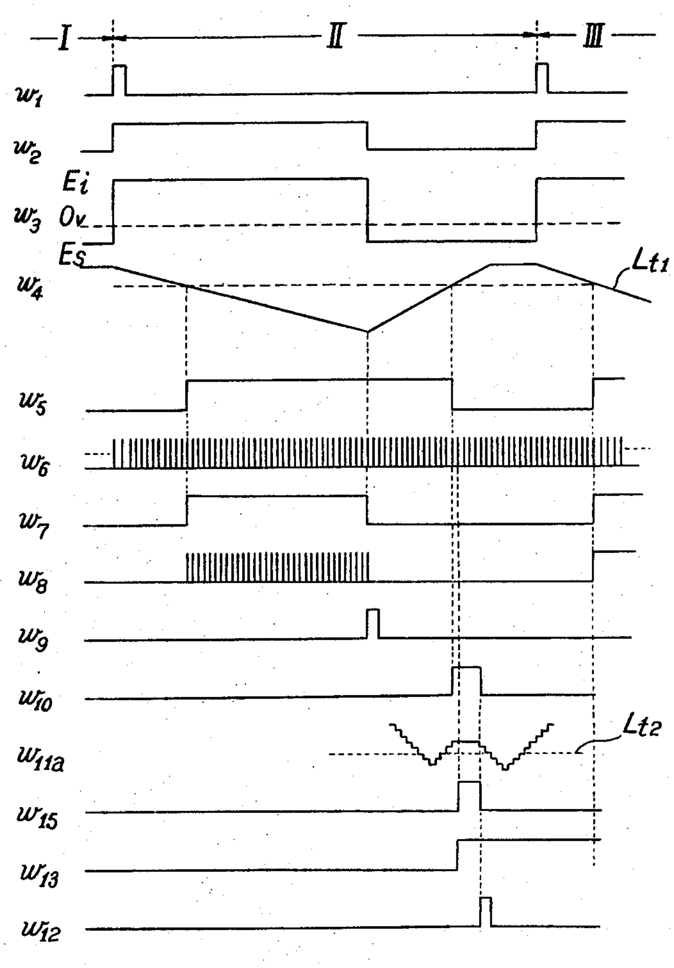
FIG. 4 shows time charts explanatory of the operation of the embodiment shown in FIG. 3.

With reference to FIGS. 3, 4 and 5, another embodiment of this invention will be described. Only circuits different from circuits of the embodiment shown in FIG. 1 are described for simple explanation. In this embodiment, a comparator 8a converts the counting result or a part of the counting result of the counter 6 to an analogue signal and compares this converted analogue signal with an analogue signal converted from the contents of the memory 7, so that a difference signal $w_{11a}$ is applied to a pulse generator 10. An example of this comparator 8a comprises, as shown in FIG. 5, a D-A converter 8–1 converting the counting result of the counter 6 to an analogue signal, a D-A converter 8–2 converting the contents of the memory 7 to an analogue signal, and a differencial amplifier 8–3 obtaining a difference between respective outputs of the D-A converters 8–1 and 8–2. The comparator 8a may be a subtractor obtaining a digital difference between respective outputs of the counter 6 and the memory 7 and a D-A converter connected to the subtractor to convert the difference to an analogue signal, which has the polarity corresponding to the sign of the digital difference and has a level corresponding to an absolute value of the digital difference. The pulse generator 10 generates a pulse $w_{15}$ having the same polarity as the output $w_{11a}$ of the comparator 8a and having a peak value proportional to the level of the output $w_{11a}$ of the comparator 8a. By way of example, the pulse generator 10 is a chopper. Other circuits are the same as corresponding circuits of the embodiment shown in FIG. 1. In operation, the output $w_{11a}$ of the comparator 8a assumes a level $L_{t2}$ (e.g.; zero) if two inputs of this comparator are the same. Since the operation of this embodiment can be understood from the analogy of the operation of the embodiment shown in FIG. 1, details are omitted.

As mentioned above, a desired analogue-digital convertion is obtainable in accordance with this invention without being affected by noise included in the input integrating signal. Moreover, convergence to an optimum integrating time can be speedy performed from both longer and shorter integrating times.

What we claim is:

1. An analogue-digital converter comprising an integrator for integrating an input analogue during a constant time, means for switching the input of said integrator to a reference voltage of reverse polarity to said input analogue signal, means including a counter for measuring the time from the switching time of the input of the integrator to the time when the output of the integrator reaches a predetermined value by counting clock pulses by said counter so that the counting result of the counter corresponds to the analogue value of the input analogue signal, a variable frequency oscillator for deviating the repetition frequency of said clock pulses, a memory for storing the counting result of the counter until the immediately succeeding counting of the clock pulses, a comparator for comparing each counting result stored in the memory with the next counting result of the counter, a variable voltage generator for generating an output whose level varies by one step of a staircase wave in response to the compared result of the comparator, so that the repetition frequency of the clock pulses is deviated by the output of the variable voltage generator until two inputs of the comparator coincide with each other, whereby the effect of noise of any repetition frequency superposed on the input analogue signal is effectively eliminated.

2. An analogue-digital converter according to claim 1, in which the comparator generates a pulse only when the two inputs of the comparator are different from each other so that the output of the variable voltage generator varies by one step of the staircase wave in response to the pulse of the comparator, the staircase wave being restored to an initial level after reaching a predetermined level.

3. An analogue-digital converter according to claim 1, in which the comparator generates a difference signal having the polarity corresponding to the sign of a digital difference between two inputs of the comparator, and that a pulse generator is further provided to generate a pulse having the polarity corresponding to the polarity of the difference signal so as to apply the pulse to the variable voltage generator.

4. An analogue-digital converter according to claim 3, in which the comparator comprises a first D-A converter for converting the counting result of the counter to a first analogue signal having a level corresponding the counting result of the counter, a second D-A converter for converting the stored contents of the memory to a second analogue signal having a level corresponding to the stored contents of the memory, and a differencial amplifier for generating an analogue signal having the polarity corresponding to the polarity of a difference between the first analogue signal and the second analogue signal.

* * * * *